US005627793A

United States Patent [19]
McClure

[11] Patent Number: 5,627,793
[45] Date of Patent: May 6, 1997

[54] CLOCK GENERATION CIRCUIT HAVING COMPENSATION FOR SEMICONDUCTOR MANUFACTURING PROCESS VARIATIONS

[75] Inventor: David C. McClure, Carrollton, Tex.

[73] Assignee: SGS-Thomson Microelectronics, Inc., Carrollton, Tex.

[21] Appl. No.: 413,789

[22] Filed: Mar. 30, 1995

Related U.S. Application Data

[63] Continuation of Ser. No. 85,751, Jun. 30, 1993, abandoned.
[51] Int. Cl.$^6$ .................................................. G11C 13/00
[52] U.S. Cl. ........................... 365/233; 365/191; 365/194
[58] Field of Search ..................................... 365/233, 194, 365/190, 191

[56] References Cited

U.S. PATENT DOCUMENTS

| | | | |
|---|---|---|---|
| 4,710,902 | 12/1987 | Pelley, IV et al. | 365/194 X |
| 4,727,519 | 2/1988 | Morton et al. | 365/233 |
| 4,800,304 | 1/1989 | Takeuchi | 365/194 X |
| 4,841,488 | 6/1989 | Sanada | 365/233 |
| 4,866,675 | 9/1989 | Kawashira | 365/194 |
| 5,424,985 | 6/1995 | McClure et al. | 365/233 X |

FOREIGN PATENT DOCUMENTS 0233550  8/1987  European Pat. Off. .

Primary Examiner—Do Hyun Yoo
Attorney, Agent, or Firm—Theodore E. Galanthay; Kenneth C. Hill; Lisa K. Jorgenson

[57] ABSTRACT

A method and circuit for significantly reducing a delay added to a clock signal which clocks an output of a first circuit into an input of a second circuit in a semiconductor device. An output of a first circuit is connected to a data line. The first circuit is designed with elements having a selected set of design parameters, such as transistor dimensions and transistor orientation. A second circuit is connected to the data line and also receives a clock signal generated by a signal delay circuit. The signal delay circuit receives an output enable signal, and after a delay period, produces the clock signal in response to the output enable signal. At least a portion of the signal delay circuit utilizes elements having the selected set of design parameters utilized in the first circuit. Thus, as process variations affect the electrical properties and the speed of the transistors in the first circuit, the same process variations will proportionately affect the electrical properties and speed of transistors in the delay circuit. This automatically compensates for process-induced speed variations and eliminates the need for a time margin when providing a clock signal for clocking an output of a first circuit into the input of a second circuit.

13 Claims, 4 Drawing Sheets

CLOCK GENERATION CIRCUIT HAVING COMPENSATION FOR SEMICONDUCTOR MANUFACTURING PROCESS VARIATIONS

This is a continuation of application Ser. No. 08/085,751, filed Jun. 30, 1993, now abandoned.

BACKGROUND OF THE INVENTION

1. Field of the Invention

The present invention relates in general to semiconductor devices, and more particularly to internally synchronous digital semiconductor devices. Still more particularly, the present invention relates to delay circuits utilized to generate a clock signal for controlling an input circuit in a digital semiconductor device.

2. Description of the Prior Art

Desirable design goals in electronic semiconductor manufacturing include a potential for significant cost reduction during the life of the design, high speed operation, low power consumption, and good reliability. In order to attain the goal of high speed operation, the many intermediate operations performed within the semiconductor device must be performed as quickly as possible, and with as little delay between operations as is practical to ensure reliable operation. Such intermediate operations may be synchronized by an internal clock signal. For example, if an output signal of a first intermediate operation is used as an input signal for a second intermediate operation, an internal clock signal may be utilized to synchronize the transfer of the output signal of the first intermediate operation to the input circuit of the second intermediate operation.

Unfortunately, increasing the speed of a semiconductor device is not as simple as increasing the speed of the internal clock which synchronizes the intermediate operations. One obstacle to increasing the speed of a semiconductor device is the amount of time required to transfer an output signal from a circuit performing a first intermediate operation to an input of a circuit performing a second intermediate operation.

One contributor to such a signal transfer delay is the operating speed of individual transistors within the semiconductor device. In many semiconductor devices, transistors are utilized in digital circuits in a manner that resembles an ordinary switch. However, such "transistor switches" do not "turn on" or "turn off" instantaneously; it takes a finite amount of time to move an electrical charge, which is sufficient to "turn on" or "turn off" the transistor, into or out of the semiconductor structure that forms the transistor. This time required to move a sufficient electrical charge to either "turn on" or "turn off" a transistor may be referred to as the transistor switching time and is typically in the range of a few nanoseconds.

In addition to high speed transistor operation, another semiconductor device design goal is to make the transistors within the device as small as practicable. A smaller transistor design allows designers to make devices having more transistors, and consequently, to make devices having greater functionality. There are problems, however, with fabricating devices with smaller transistors. For example, smaller transistors are more susceptible than larger transistors to manufacturing process variations, such as pattern alignment and chemical etching, during the many steps of semiconductor manufacturing. The reason for this increased susceptibility is that using a fabrication process step that produces transistor geometries such as channel length and channel width accurate to within two units to fabricate a transistor that is, for example, one hundred units wide affects the electrical characteristics of that transistor proportionately less than using the same process step to fabricate a transistor that is ten units wide. Proportionately, the larger transistor's geometry is affected by two percent, while the smaller transistor's geometry is affected by twenty percent. Such process variations may cause the electrical properties of the transistors to vary, which may result in slower switching speeds.

Therefore, the overall speed of the device may be increased, but the uncertainty of transistor operating speed due to process variations from a selected set of design parameters may require designers to include an additional delay between intermediate operations to increase production yields. Production yield decreases as devices fail to function because of data errors, which may result from a signal transfer time increase in combination with a clock signal that prematurely clocks erroneous data into an input circuit. The timing involved in "clocking" signals between circuits is discussed in greater detail below.

In addition to the delay resulting from transistor switching time, semiconductor device speed may also be reduced by the electrical properties, such as capacitance and resistance, or impedance of interconnect lines within the semiconductor device. Interconnect lines may be conductors extending from a circuit in one part of the semiconductor device to a circuit in another part of the device, such as, for example, a "bit line" used to transfer data from a memory cell to a sense amplifier in a semiconductor memory device. A typical bit line extends from a memory cell, located in a memory array, across the memory array (which may be a substantial distance in terms of semiconductor geometries), to a sense amplifier, wherein such a transferred signal is prepared for transmission out of the semiconductor device. If an interconnect line has a relatively large intrinsic capacitance and resistance, it may take a considerable amount of time to transfer a signal via such an interconnect line. As the length of the interconnect line increases, the resistance and capacitance of the line may increase proportionately.

It is well known in the art of semiconductor design to utilize a clock signal to more precisely control the timing of intermediate operations, and the flow of input and output signals between circuits performing intermediate operations. Some clock signals within the semiconductor may be used to enable a circuit to "output" a signal, while other clock signals may be used to enable a circuit to receive or input a signal. Since it takes some time for a transistor to "turn on" an output signal after receiving an enabling output clock, and it takes some time for an output transistor to change the voltage of an interconnect line having a characteristic impedance, an output signal from one circuit will not be immediately available as the input for a second circuit. Therefore, the clock signal utilized to enable the output a signal from a first circuit may not always be utilized as an input clock to enable the input of that same "output signal" into a second circuit. Stated differently, the clock signal for the input to the second circuit must occur sometime after the clock signal for the output of the first circuit so that the signal is allowed enough time to transfer between the two circuits.

To determine such a time difference between an output clock signal and an input clock signal, the designer must be able to calculate or predict transistor switching times, and the time necessary to "drive" or transfer the signal via the interconnecting line. Typically, once the designer has calculated the time required for a typical signal transfer, the designer includes an additional amount of time to compensate for variations in transistor switching times and "interconnect line drive times" which may occur due to variations in the numerous process steps required to make the semiconductor device.

In present semiconductor devices, the input clock signal may be delayed until such time as the output signal from the output circuit is likely to be present at the input circuit, considering worst-case process variations, which would cause a worst-case signal transfer time. Such worst-case process analysis includes the consideration of variations in process steps, such as chemical baths and mask alignment, which approach the extremes of process specifications, and the effect that such process variations may have on transistor switching times and the capacitance and resistance, or characteristic impedance, of interconnect lines.

As the semiconductor device is fabricated, it is subjected to a number of doping, layering, and patterning processes, each of which must meet stringent physical and cleanliness requirements. Such sophisticated processes will vary from one batch of semiconductor devices to another, resulting in speed variations from device to device. Even though the process is monitored and continually calibrated, some variation in the equipment and chemicals is inevitable. All of the tests and process specifications allow for some variation; that is, each semiconductor wafer experiences process variations, which may cause operational speed variations.

In the case of a semiconductor memory device, for example, process variations may affect the operational speed of the transistors comprising the individual memory cells. Additionally, process variations may affect the electrical characteristics (such as impedance), and hence the signal transfer time, of the bit line, which transfers the data signal from the memory cell to a clocked sense amplifier which determines what data was stored in the memory cell. This data signal transfer is controlled by a word line enable clock signal, which enables the output of the memory cell, and a sense clock signal, which enables the clocked sense amplifier to sense the data transferred via the bit lines.

In known memory devices, an additional amount of time is added to the calculated amount of delay between an active word line enable clock signal and an active sense clock signal that should permit normal, error-free operation. Such a calculated amount of delay corresponds to the amount of time required for the data signal to be transferred from the memory cell to the clocked sense amplifier, via the bit lines, in a device manufactured under the exact process conditions and design parameters, specified by the designer. The additional amount of time (i.e., time added as a design margin) is added to increase device yield by allowing for slower data signal transfers due to process variations, which may be well within specified tolerances. The drawback of increasing process yield by adding such a design margin time is that all devices are slower, even though some devices may operate internally at a higher speed.

Therefore, it would be desirable to provide a method and circuit for automatically compensating a delay circuit, which is used to delay an input clock signal, in proportion to signal transfer speed variations due to process variations in the manufacture of semiconductor devices.

SUMMARY OF THE INVENTION

A method and circuit are provided for significantly reducing a delay added to a clock signal which clocks an output of a first circuit into an input of a second circuit in a semiconductor device. An output of a first circuit is connected to a data line. The first circuit is designed with elements having a selected set of design parameters, such as transistor dimensions and transistor orientation. A second circuit is connected to the data line and also receives a clock signal generated by a signal delay circuit. The signal delay circuit receives an output enable signal, and after a delay period, produces the clock signal in response to the output enable signal. At least a portion of the signal delay circuit utilizes elements having the selected set of design parameters utilized in the first circuit. Thus, as process variations affect the electrical properties and the speed of the transistors in the first circuit, the same process variations will proportionately affect the electrical properties and speed of transistors in the delay circuit. This automatically compensates for process-induced speed variations and eliminates the need for a time margin when providing a clock signal for clocking an output of a first circuit into the input of a second circuit.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
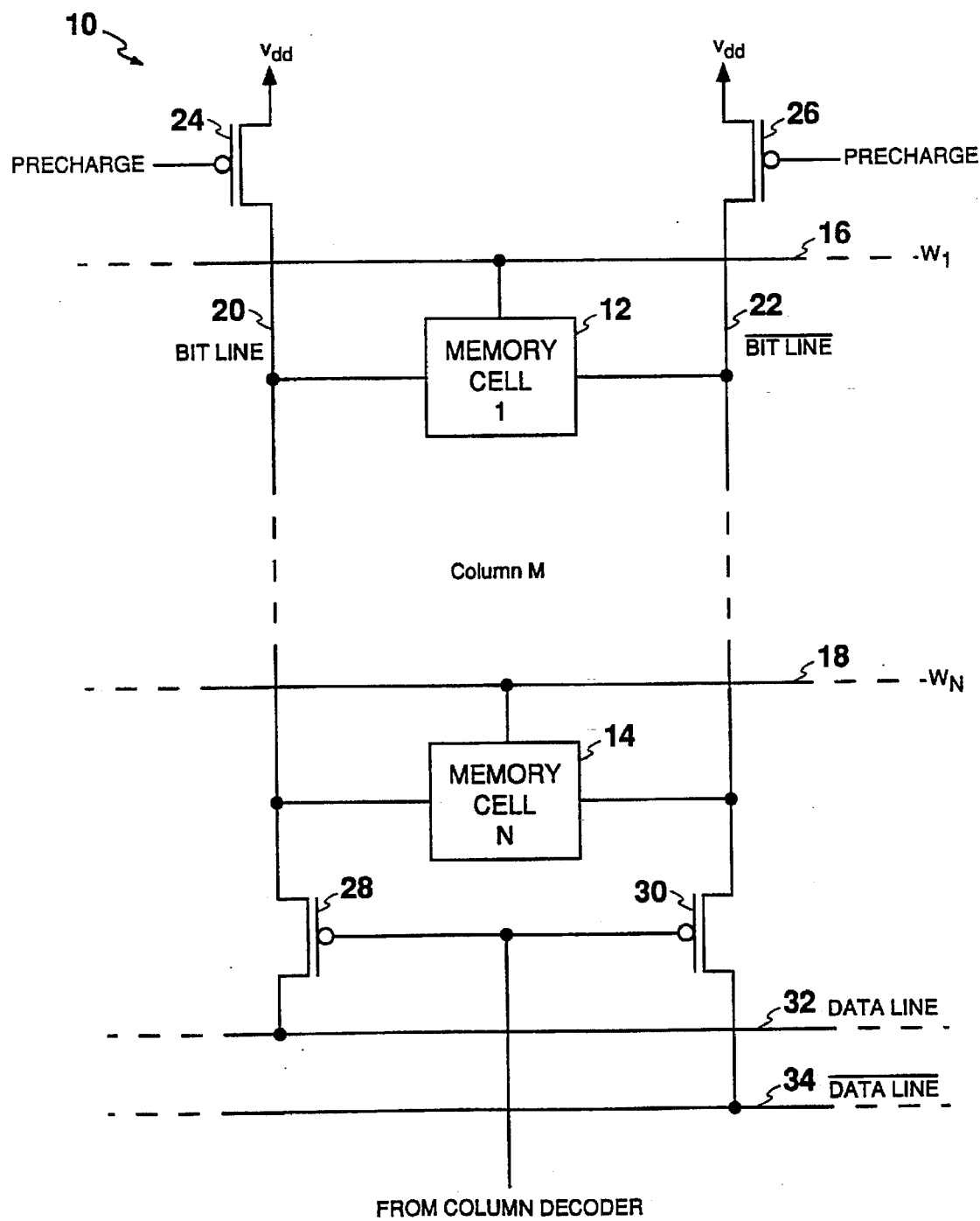
FIG. 1 depicts a high level block diagram of a portion of a memory cell array in a semiconductor memory device.

With reference now to the figures and in particular with reference to FIG. 1, there is depicted a high level block diagram of a portion of a memory cell array in a semiconductor memory device. Memory cells 12 and 14 are part of a memory array 10, which may include many columns and many rows of similar memory cells. For example, a single semiconductor memory device may contain $2^{20}$ memory cells (one megabit), and may be physically organized in any of a number of different layouts. Memory cells 12 and 14, and the remainder of the memory cells which comprise memory array 10 which are not shown, each store one data bit. To access a cell in memory array 10, a memory address is received into the memory device and decoded to determine a row and column address.

All cells in each row are connected to a "word line." In FIG. 1, word lines 16 and 18 are shown connected to cells 12 and 14 respectively. Word lines 16 and 18 are selected by "row decoder" circuitry (not shown). In a similar manner, all cells in each column are connected to a pair of "bit lines" 20 and 22, which are selected by "column decoder" circuitry (not shown). Bit lines 20 and 22 are connected to memory cells 12 and 14, and the other memory cells in the same column which are not illustrated. Transistors 24 and 26 serve as loads for the bit lines 20 and 22. When the column shown in FIG. 1 is not selected, transistors 24 and 26 precharge bit lines 20 and 22 to a DC voltage level close to the supply voltage. Transistors 28 and 30 are selected by the column decoder circuitry, and, when selected, connect bit lines 20 and 22 to data lines 32 and 34.

Figure 2:
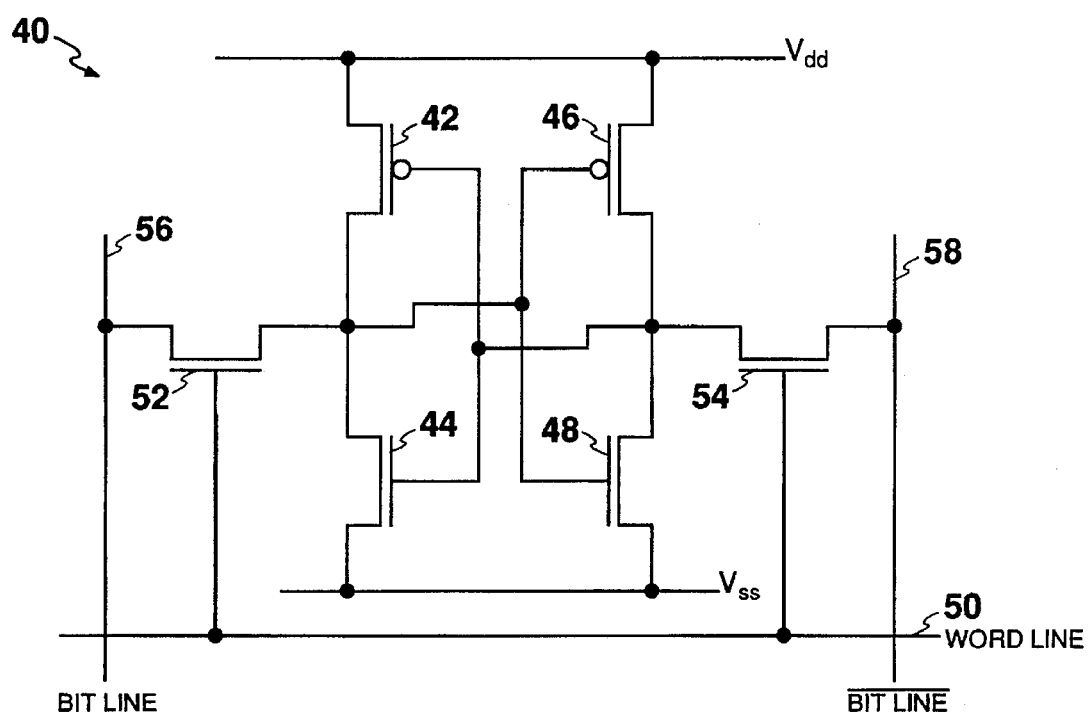
FIG. 2 illustrates a high level block diagram of a memory cell, such as the memory cells shown in FIG. 1.

FIG. 2 depicts a high level block diagram of a memory cell 40, which may be utilized to implement memory cells 12 and 14 shown in FIG. 1. Memory cell 40 is an example of a static RAM cell. Memory cell 40 is largely comprised of a latch circuit formed by cross-coupling two inverters. Transistors 42 and 44 are part of a first inverter circuit, and transistors 46 and 48 are part of a second inverter circuit. As illustrated, the output of the first inverter circuit is used as the input of the second inverter circuit, and the output of the second inverter circuit is used as the input of the first inverter circuit. Word line 50 carries a signal that enables transistors 52 and 54, thereby permitting data to be transferred into or out of memory cell 40, via bit lines 56 and 58. When data is transferred out of memory cell 40, one of the cross-coupled inverters in the memory cell will discharge one of the associated bit lines, while the other cross-coupled inverter will not discharge the other bit line, depending upon what data was stored in memory cell 40. Thus, the data signal on bit line 56 is the complement or opposite of the data signal on bit line 58. In some designs, transistors 42 and 46 may be replaced with resistive load elements.

Figure 3:
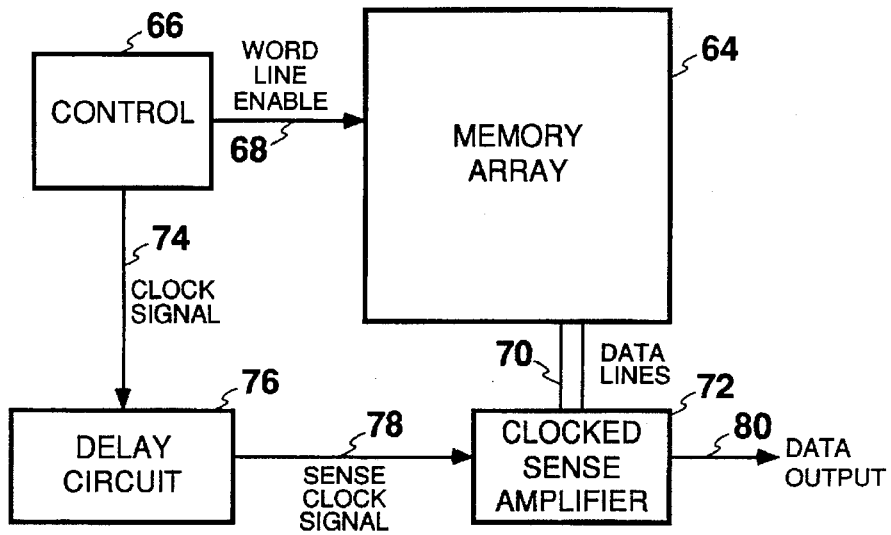
FIG. 3 depicts a high level block diagram of a portion of a semiconductor memory device.

Referring to FIG. 3, a high level block diagram of a portion of a semiconductor memory device is illustrated. In order to recall data from a memory array 64, a control circuit 66 produces a word line enable signal 68. Word line enable signal 68 causes a row of selected memory cells within memory array 64 to output data. One such cell utilizes a pair of data lines 70, which are connected to a clocked sense amplifier 72. Control circuit 66 also produces a clock signal 74 which is connected to a delay circuit 76. Delay circuit 76 produces a sense clock signal 78, which is connected to clocked sense amplifier 72, and causes clocked sense amplifier 72 to read a data signal on data lines 70. This data read by clocked sense amplifier 72 is determined by which one of two data lines 70 has been discharged by a cross-coupled inverter in memory cell 40. After clocked sense amplifier 72 determines what data is represented by the signals on data lines 70, clocked sense amplifier 72 may latch, and thereafter output such sensed data via data output line 80.

Figure 4:
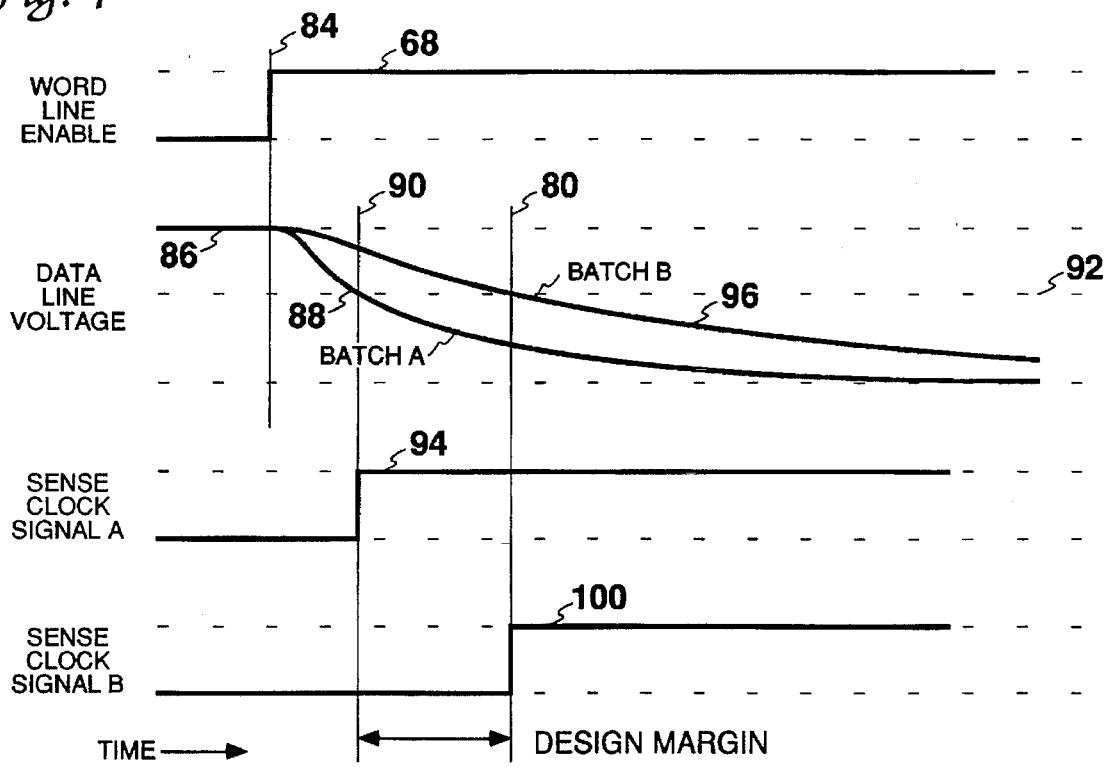
FIG. 4 illustrates a timing diagram for the circuit of FIG. 3.

Referring now to FIG. 4, a timing diagram for the circuit of FIG. 3 is illustrated. During the process of recalling data from memory array 64, the word line enable signal 68 enables a selected memory cell to output data via data lines 70, at a time indicated by numeral 84 (time 84). Shortly after word line enable 68 is activated at time 84, data line voltage 86 begins to fall on one of the data lines 70, while the other data line remains high or charged. Batch A 88 illustrates how the voltage should drop on a data line 70 in a semiconductor memory device which has been processed under an ideal set of process steps having no process variation. At time 90, the data line voltage 86 of a data line 70 has dropped to a voltage level 92 such that the clocked sense amplifier 72 may correctly and reliably determine what data has been transferred via data lines 70 by measuring the differential voltage between data lines 70. Voltage level 92 may be considered a "threshold" voltage of the clocked sense amplifier 72. That is, if the clocked sense amplifier receives a sense clock signal prematurely, and a data line signal having a voltage higher than "threshold" voltage level 92 is sensed, a data error may occur.

To illustrate the effect process variations may have upon signal transfer speed and sense clock signal timing, two data line voltage curves 86 are illustrated: a batch A 88 voltage curve depicting a rate of voltage change on a data line in a device fabricated under batch A process conditions, and a batch B 96 voltage curve depicting a rate of voltage change on a data line in a device fabricated under batch B process conditions. Therefore, in light of the rate at which data line voltage 86 falls to voltage level 92 in a device produced in batch A 88, clocked sense amplifier 72 may be clocked and caused to sense the voltage on data lines 70 at time 90, as indicated by sense clock signal A 94.

The voltage curve associated with batch B 96 indicates the rate at which voltage may drop on data lines 70 in a semiconductor fabricated in a batch of semiconductor devices under the same general process steps as batch A, but with different specific parameters, which fall within specified tolerance limits, from the specific parameters of batch A 88. As illustrated, the data line voltage 70 of batch B 96 discharges more slowly than the data line 70 of a part produced in batch A 88. Due to such process variations during the fabrication of batch B 96, the clocked sense amplifier 72 in batch B 96 parts must be sensed at time 80, so that data line voltage 86 has dropped to voltage level 92, as illustrated by sense clock signal B 100. In the prior art, a designer must add an additional delay time to the sense clock signal to ensure the devices of batch B 96 would operate properly. Such additional delay time is the amount of time between time 90 and time 80, labeled "Design Margin."

Figure 5:
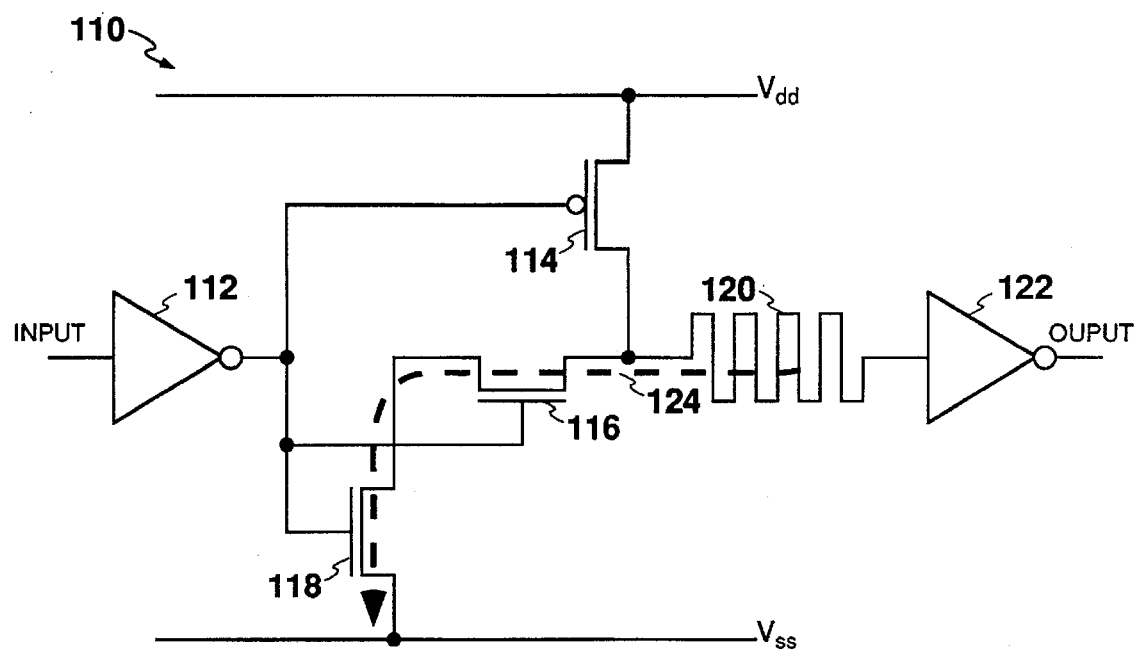
FIG. 5 depicts a high level schematic diagram of a portion of a delay circuit in accordance with the present invention.

Referring now to FIG. 5, a delay circuit 110 for generating a clock signal in accordance with the present invention is illustrated. A signal to be delayed enters delay circuit 110 at the input of inverter 112. The output of inverter 112 is connected to the gates of transistors 114, 116, and 118, which are connected and arranged to form an inverter circuit. When a "high" (a voltage close to $V_{dd}$) is applied to the input of this three-transistor inverter circuit, transistor 114 will turn off and transistors 116 and 118 will turn on, which will attempt to drive the three-transistor inverter output "low" (a voltage close to $V_{ss}$). Conversely, when a low is applied to the input, transistor 114 will turn on and transistors 116 and 118 will turn off, which will attempt to drive the three-transistor inverter output high.

In accordance with the present invention, the size (including channel length and width, orientation, and other design parameters of transistors 116 and 118 are selected to emulate the performance of transistors 54 and 48, or of transistors 52 and 44, of memory cell 40, illustrated in FIG. 2. Transistors 116 and 118 may have the exact same layout as transistors 54 and 48, and transistors 52 and 44. Therefore, as transistors B4 and 48, or transistors 52 and 44, of memory cell 40 are affected by process variations, transistors 116 and 118 will be similarly affected. If, due to process variations, transistors 54 and 48, or transistors 52 and 44, of memory cell 40 operate slower, which causes the signal developed by memory cell 40 to appear at the input of clocked sense amplifier 72 at a later time, then transistors 116 and 118, which are similarly affected by process variations, will delay sense clock signal 78 by a proportional amount of time, so that clocked sense amplifier 72 is clocked by sense clock signal 78 when the signal developed by memory cell 40 arrives at the input of clocked sense amplifier 72.

Because the electrical characteristics, such as characteristic impedance, of bit lines 56 and 58 have an effect on the timing of the data transfer from memory cell 40 to clocked sense amplifier 72, a bit line emulation structure 120 is connected between the output of the three-transistor inverter and inverter 122, so that the amount of delay produced by delay circuit 76 more closely tracks the delay of memory cell 40, which drives bit line 56 or 58. The discharge path 124 through bit line emulation structure 120 and transistors 116 and 118 emulates the discharge path of memory cell 40, which passes through bit line 56 or 58 and transistors 54 and 48, or 52 and 44 of FIG. 2.

Those persons skilled in the art of semiconductor design will appreciate that the resistance and capacitance of bit line emulation structure 120 need not be the same as either bit line 56 or 58, because bit line emulation structure 120 must be discharged to a voltage which can be sensed by inverter 122. Therefore, bit line emulation structure 120 may be only 20% as long as bit line B6 or 58, which would allow bit line emulation structure 120 to discharge to below two volts (which may be the threshold voltage of the input to inverter 122) in an amount of time proportionate to the time required to discharge bit line 56 or 58 by 100 millivolts (which may be the threshold voltage of the input to clocked sense amplifier 72). The design of bit line emulation structure 120 should be coordinated with the selection of an input threshold for inverter 122.

Therefore, to produce a higher device yield and to produce a faster device, at least a portion of the circuit of the memory cell is duplicated as part of the delay circuit, in an effort to duplicate the signal path from the memory cell to the clocked sense amplifier. By including a circuit similar to the memory cell circuit in the delay circuit, the delay circuit will automatically increase the delay time to compensate for increased signal transfer time due to the effects of process variation on memory cell circuitry. The automatic increase in delay time means that a device may be designed for a typical sense clock signal delay, and not a worse-case delay. By replicating at least a part of the memory cell circuit in the delay circuit, devices may be designed without the previously required additional delay time included as a design margin to increase device yield, and which makes every device operate slower. After incorporating the present invention, every device may operate at its highest potential speed, rather than all devices operating at a slower speed by an amount of time equal to the design margin (the difference between time 80 and time 90). This additional amount of time, although measured in nanoseconds, can determine whether or not a device will perform a function in a data processing system designed for operation at a particular speed.

Those persons skilled in the art of semiconductor design will recognize that in order to duplicate the effect of process variations on signal transfer, the "output load" of a particular circuit may also be replicated in the delay circuit. For example, the load connected to the output of memory cell 40 is largely bit line 56 or 58, which has an inherent resistance and capacitance. At least a portion of a line representing the bit line may be included in the delay circuit connected to the output of the circuit replicating the memory cell to act as a load emulation structure having an impedance proportional to the characteristic impedance of the data line or bit line.

An example of such a line is bit line emulation structure 120. Bit line emulation structure 120 may be fabricated from the same material, with the same width dimensions, and placed over the same underlying material and geometries, as bit lines 56 and 58. Such underlying material may simulate word lines, or other structures affecting the electrical properties of the bit line, over which the bit line lies. Similarly, overlying material may also be considered in bit line emulation structure 120 design. To more efficiently utilize space, bit line emulation structure 120 may be laid out in a serpentine pattern. By including bit line emulation structure 120 in delay circuit 76, process variations which affect the electrical characteristics of the memory cell load will proportionately affect the replica load, such as bit line emulation structure 120, in the same manner, thereby compensating the delay of sense clock signal 78 for process variations during fabrication.

Those persons skilled in the art will also recognize that other circuits may be included in the delay circuit, so long as such circuits are affected by process variations in proportion to the effect process variations have on a circuit supplying a clocked output signal to another circuit having a clocked input signal. That is, the delay circuit need not physically replicate the output circuit and load of a first circuit; the delay circuit need only include a circuit having a signal transfer time affected by process variations in proportion to the effects those same process variations would have on the output circuit and load of the first circuit. Therefore, a set of transistors duplicating transistors 116 and 118 may be added in parallel with transistors 116 and 118 (thereby creating a parallel current path), and the overall delay produced by delay circuit 110 will continue to be proportional to the delay of the signal developed by memory cell 40.

Moreover, additional circuits may be added to the delay circuit to more thoroughly duplicate the circuit supplying the clocked output signal. For example, transistors 28 or 30, which are each in a signal path from memory cell 40 to clocked sense amplifier 72, may be duplicated in delay circuit 76.

While the invention has been particularly shown and described with reference to a preferred embodiment, it will be understood by those skilled in the art that various changes in form and detail may be made therein without departing from the spirit and scope of the invention.

What is claimed is:

1. A memory circuit for use with a static memory array comprising:

a memory cell having discharging transistors for discharging a data line in response to an enable signal, wherein the discharging transistors are each fabricated according to a selected set of design parameters, and wherein at least one of the discharging transistors is connected to the data line;

a clocked sense amplifier connected to the data line and a sense clock signal; and a signal delay circuit for generating the sense clock signal in response to a clock signal, wherein the delay circuit has a plurality of delay circuit transistors, and wherein at least one of the plurality of delay circuit transistors is fabricated according to the selected set of design parameters used to fabricate one of the discharging transistors, wherein said signal delay circuit is affected by process variations during fabrication in a manner in which the memory cell is affected.

2. The memory circuit of claim 1 wherein the selected set of design parameters includes transistor dimensions and transistor orientation.

3. The memory circuit of claim 2 wherein the transistor dimensions includes transistor channel length and transistor channel width.

4. The memory circuit of claim 1 wherein the discharging transistors are fabricated according to a layout, and wherein the signal delay circuit is fabricated according to a substantial replica of the layout of at least a portion of the memory cell.

5. The memory circuit of claim 4 wherein the memory cell includes an N-channel discharging transistor enabled by the enable signal connected in series with an N-channel discharging transistor connected to a low reference voltage for discharging the data line, wherein the substantial replica of the layout of at least a portion of the memory cell includes a first N-channel delay circuit transistor and a second N-channel delay circuit transistor, the first N-channel delay circuit transistor having geometries and orientation substantially the same as the memory cell N-channel discharging transistor enabled by the enable signal, and the second N-channel delay circuit transistor having geometries and orientation substantially the same as the memory cell N-channel discharging transistor connected to the low reference voltage for discharging the data line, wherein the first and second N-channel delay circuit transistors are connected in series.

6. The memory circuit of claim 4 wherein the signal delay circuit includes two substantial replicas of the layout of at least a portion of the memory cell connected in parallel, wherein the two substantial replicas of the layout of at least a portion of the memory cell are connected to the data line and a low reference voltage.

7. The memory circuit of claim 1 wherein the data line has a characteristic impedance, and wherein the signal delay circuit further includes a load emulation structure having an impedance proportional to the characteristic impedance of the data line.

8. The memory circuit of claim 7 wherein the data line has an underlying or overlying material having a selected geometry, and wherein the load emulation structure has a replica of at least a portion of the underlying or overlying material having the selected geometry, underlying or overlying the load emulation structure.

9. The memory circuit of claim 7 wherein the load emulation structure having the impedance proportional to the characteristic impedance of the data line is laid out in a serpentine pattern.

10. A method in a semiconductor memory device for generating a sense clock signal for a clocked sense amplifier, the semiconductor memory device having a memory cell including transistors connected to a data line and an enable signal, wherein the memory cell has physical characteristics including transistor dimensions and transistor orientation and the data line has physical characteristics including a characteristic impedance, the method comprising the steps of:

generating the enable signal and a clock signal;

generating a data signal on the data line in response to the enable signal, wherein the data signal appears on the data line after a delay caused by the physical characteristics of the memory cell and the data line;

delaying the clock signal in proportion to the delay of the appearance of the data signal on the data line caused by the physical characteristics of the memory cell and the data line to generate a sense clock signal;

clocking the clocked sense amplifier utilizing the sense clock signal; and sensing data represented by the data signal in response to the sense clock signal.

11. The method in the semiconductor memory device for generating the sense clock signal according to claim 10 wherein the semiconductor memory device includes a delay circuit having an inverter having physical characteristics proportional to those of the memory cell, and wherein the step of delaying the clock signal further includes processing the clock signal through the inverter having the physical characteristics proportional to those of the memory cell.

12. The method in the semiconductor memory device for generating the sense clock signal according to claim 11 wherein the semiconductor memory device is fabricated on a semiconductor substrate, and wherein the transistors in the memory cell are fabricated utilizing a geometric pattern, and wherein the inverter having the physical characteristics proportional to those of the memory cell includes inverter transistors fabricated utilizing the geometric pattern used to fabricate the transistors in the memory cell, and wherein the inverter transistors have the same orientation with respect to the semiconductor substrate as the orientation of the transistors in the memory cell.

13. A circuit for use with a static memory array comprising:

a memory cell having discharging transistors including a first N-channel discharging transistor connected in series with a second N-channel discharging transistor, wherein the first N-channel discharging transistor is connected to a data line and enabled by an enable signal, and wherein the second N-channel discharging transistor is connected to a low reference voltage, and wherein the data line may be discharged by said first and second N-channel discharging transistors in response to the enable signal, and wherein the discharging transistors are fabricated according to a layout and a selected set of design parameters for each of the discharging transistors, wherein the layout specifies geometries and orientation of each of the discharging transistors;

a clocked sense amplifier connected to the data line and a sense clock signal; and a signal delay circuit, connected to a clock signal, for generating the sense clock signal, wherein the delay circuit has a plurality of delay circuit transistors including a first N-channel delay circuit transistor connected in series with a second N-channel delay circuit transistor, wherein said delay circuit transistors are fabricated in a layout that is a substantial replica of the layout of at least a portion of the memory cell, and wherein the first N-channel delay circuit transistor is fabricated with geometries and orientation that are substantially the same as those used to fabricate the first N-channel discharging transistor, and the second N-channel delay circuit transistor is fabricated with geometries and orientation that are substantially the same as those used to fabricate the second N-channel discharging transistor.

* * * * *